United States Patent
Hong et al.

(10) Patent No.: US 8,829,686 B2
(45) Date of Patent: Sep. 9, 2014

(54) PACKAGE-ON-PACKAGE ASSEMBLY INCLUDING ADHESIVE CONTAINMENT ELEMENT

(71) Applicant: Samsung Electronics Co., Ltd., Suwon-si (KR)

(72) Inventors: Ji-Sun Hong, Asan-si (KR); Young-Min Kim, Asan-si (KR); Jung-Woo Kim, Siheung-si (KR); Min-Ok Na, Bucheon-si (KR); Hyo-Chang Ryu, Asan-si (KR); Jong-Bo Shim, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 13/678,205

(22) Filed: Nov. 15, 2012

(65) Prior Publication Data

US 2013/0187288 A1    Jul. 25, 2013

(30) Foreign Application Priority Data

Jan. 20, 2012 (KR) ........................ 10-2012-0006914

(51) Int. Cl.
*H01L 23/48* (2006.01)
*H01L 23/52* (2006.01)
(Continued)

(52) U.S. Cl.
CPC ....... *H01L 23/498* (2013.01); *H01L 2225/1023* (2013.01); *H01L 2924/18161* (2013.01); *H01L 2224/16225* (2013.01); *H01L 2224/32225* (2013.01); *H01L 2225/06517* (2013.01); *H01L 2224/16145* (2013.01); *H01L 2224/73253* (2013.01); *H01L 2225/06565* (2013.01); *H01L 2924/15311* (2013.01); *H01L 2225/06541* (2013.01); *H01L 2225/06513* (2013.01); *H01L 25/105* (2013.01); *H01L 2924/1815* (2013.01); *H01L 2224/48227* (2013.01); *H01L 23/3128* (2013.01); *H01L 2224/73265* (2013.01); *H01L 2924/15321* (2013.01); *H01L 2225/1058* (2013.01); *H01L 2224/45139* (2013.01); *H01L 23/49816* (2013.01)
USPC ........... 257/777; 257/686; 257/790; 257/778; 257/783; 257/786

(58) Field of Classification Search
USPC ......... 257/685, 686, 777, 723, 787, 790, 778, 257/782, 783, 786, E31.117, E31.118, 257/E51.02, E23.116, E25.006, 257/E25.013–E25.018, E25.021, E25.027, 257/E25.031, E25.032, E23.042
See application file for complete search history.

(56) References Cited

U.S. PATENT DOCUMENTS 7,851,894 B1    12/2010  Scanlan
7,923,790 B1 *   4/2011  Quevy et al. .................. 257/415

(Continued)

FOREIGN PATENT DOCUMENTS

KR    10-1020612    11/2009

*Primary Examiner* — Matthew Reames
*Assistant Examiner* — Dilinh Nguyen
(74) *Attorney, Agent, or Firm* — Onello & Mello, LLP

(57) ABSTRACT

A package-on-package assembly includes first and second packages and an adhesion member positioned between the first and second packages and adhering the first and second packages to one another. The first package may include a first substrate having a first surface and a second surface facing each other and including a land pad formed on the first surface, a first semiconductor chip formed on the first surface, and a first encapsulant member encapsulating the first surface and the first semiconductor chip and including a through-via spaced apart from the first semiconductor chip and exposing the land pad and a trench formed between the first semiconductor chip and the through-via, and wherein at least a portion of the trench is filled with adhesion member material.

19 Claims, 12 Drawing Sheets

(51) Int. Cl.
*H01L 29/40* (2006.01)
*H01L 23/29* (2006.01)
*H01L 23/498* (2006.01)
*H01L 25/10* (2006.01)
*H01L 23/31* (2006.01)

(56) References Cited

U.S. PATENT DOCUMENTS 8,012,797 B2 * 9/2011 Shen et al. .................. 438/107
2012/0104625 A1 * 5/2012 Park et al. .................. 257/774

* cited by examiner

1300

PACKAGE-ON-PACKAGE ASSEMBLY INCLUDING ADHESIVE CONTAINMENT ELEMENT

CROSS-REFERENCE TO RELATED APPLICATION

This application claims priority from Korean Patent Application No. 10-2012-0006914 filed on Jan. 20, 2012 in the Korean Intellectual Property Office, and all the benefits accruing therefrom under 35 U.S.C. 119, the contents of which in its entirety are herein incorporated by reference.

BACKGROUND

1. Field

Inventive concepts relate to a package-on-package assembly.

2. Related Art

One constant in the world of electronics is the demand for increased functional density: greater circuit capacity packed within ever-smaller volumes. One approach to achieving such miniaturization is a packaging technique referred to as "package-on-package," which unites a plurality of semiconductor packages as one. As the capacities of the united packages increase, the interconnection requirements may increase and, in order to satisfy the need for greater interconnection capacity without increasing the volume of the package-on-package, individual interconnections are reduced in size. That is, finer-pitch interconnections may be employed to address the demands for a greater number of interconnections within a given space. However, as interconnection pitch is decreased, the area of contact, and resultant adhesive force, between the interconnection and packages' landing pads may be decreased. As a result, the security of the connections may be compromised and the compromised connections may lead to failure of the package-on-package system.

The adhesive force between the top package and the bottom package may be increased by using an additional adhesion member, thereby lessening the stress on the interconnection. A top solder ball attached to the top package and a bottom solder ball attached to the bottom may be adhered to each other to form an interconnection using a reflow process. However, if the top and bottom solder balls are smeared with adhesion member material during the reflow process, a wetting problem may be created for the top and bottom solder balls, thereby reducing the reliability of the interconnection.

SUMMARY

In an exemplary embodiment in accordance with principles of inventive concepts, a package-on-package assembly may include an adhesion member that adheres one package to another. A reservoir, such as a trench, for example, may be positioned to prevent the flow of adhesion member material beyond a prescribed region and, thereby, prevent adhesion member material from flowing to an inner connection, which may be formed by reflowing solder balls, or from flowing to a through-via.

In an exemplary embodiment in accordance with principles of inventive concepts, a package-on-package assembly may include a first package, a second package formed on the first package, and an adhesion member positioned between the first and second packages and adhering the first package and the second package to one another. The first package may include a first substrate having a first surface and a second surface facing each other and a land pad formed on the first surface, a first semiconductor chip formed on the first surface, and a first encapsulant member encapsulating the first surface and the first semiconductor chip and a through-via spaced apart from the first semiconductor chip and exposing the land pad and a trench formed between the first semiconductor chip and the through via. At least a portion of the trench may be filled with adhesion member material.

In an exemplary embodiment in accordance with principles of inventive concepts, a package-on-package assembly includes a first package, a second package formed on the first package, and an adhesion member positioned between the first and second packages and adhering the first package and the second package to one another. The first package may include a substrate having a first surface and a second surface facing each other and a plurality of land pads formed on the first surface, a semiconductor chip formed on the surface, and an encapsulant member encapsulating the first surface and the semiconductor chip and including a plurality of through-vias spaced apart from the semiconductor chip to be arranged along a lateral surface of the substrate and exposing the land pads and trenches formed between the semiconductor chip and the through-vias and extending along a lateral surface of the semiconductor chip. At least a portion of the trench may be filled with adhesion member material.

A package-on-package assembly in accordance with principles of inventive concepts may include a connection terminal having one end contacting the land pad and the other end contacting the second package and passing through a via.

A package-on-package assembly in accordance with principles of inventive concepts may include a trench shaped as a groove and the first surface is not exposed by the trench.

A package-on-package assembly in accordance with principles of inventive concepts may include a portion of the first encapsulant member is positioned between the trench and the first surface.

A package-on-package assembly in accordance with principles of inventive concepts may include a first substrate comprising a solder resist layer formed on the first surface to expose the land pad, and a trench that exposes a solder resist layer, and a portion of the adhesion member material enters the trench and contacts the solder resist layer.

A package-on-package assembly in accordance with principles of inventive concepts may include an adhesion member that extends from a top portion of the first semiconductor chip and fills at least a portion of the trench without contacting the through-via.

A package-on-package assembly in accordance with principles of inventive concepts may include a trench that extends along a lateral surface of the first semiconductor chip.

A package-on-package assembly in accordance with principles of inventive concepts may include a second package that has a third surface and a fourth surface facing each other, the fourth surface including a second substrate adjacent to the first encapsulant member, a second semiconductor chip formed on the third surface of the second substrate, and a second encapsulant member encapsulating the second semiconductor chip.

A package-on-package assembly in accordance with principles of inventive concepts may include a material forming the adhesion member that is different from a material forming the first encapsulant member.

A package-on-package assembly in accordance with principles of inventive concepts may include a trench that is longer than a lateral surface of the semiconductor chip.

A package-on-package assembly in accordance with principles of inventive concepts may include a trench that extends along lateral surfaces of the semiconductor chip to surround the semiconductor chip.

A package-on-package assembly in accordance with principles of inventive concepts may include a plurality of connection terminals each having one end contacting a land pad and the other end contacting the second package and passing through a via.

A package-on-package assembly in accordance with principles of inventive concepts may include an adhesion member that extends from a top portion of the semiconductor chip and fills at least one portion of the trench while not being formed in the through-via.

An apparatus in accordance with principles of inventive concepts may include first and second semiconductor chips respectively mounted on first and second substrates; an adhesion member formed between the first and second and second substrates; and a reservoir formed on one of the substrates to contain adhesion member material.

An apparatus in accordance with principles of inventive concepts may include a through-via formed in the substrate that includes the reservoir, wherein the reservoir is configured to prevent flow of adhesion member material into the through-via.

An apparatus in accordance with principles of inventive concepts may include a reservoir that is a trench formed in encapsulant material on one of the substrates.

An apparatus in accordance with principles of inventive concepts may include internal connection terminals connecting first and second substrates, wherein the connection materials are formed of reflown conductor material.

A cellular telephone in accordance with the principles of inventive concepts may include first and second semiconductor chips respectively mounted on first and second substrates; an adhesion member formed between the first and second and second substrates; and a reservoir formed on one of the substrates to contain adhesion member material.

BRIEF DESCRIPTION OF THE DRAWINGS

The above and other features and advantages of inventive concepts will become more apparent by describing in detail preferred embodiments thereof with reference to the attached drawings in which.

DETAILED DESCRIPTION OF THE EMBODIMENTS

Figure 1:
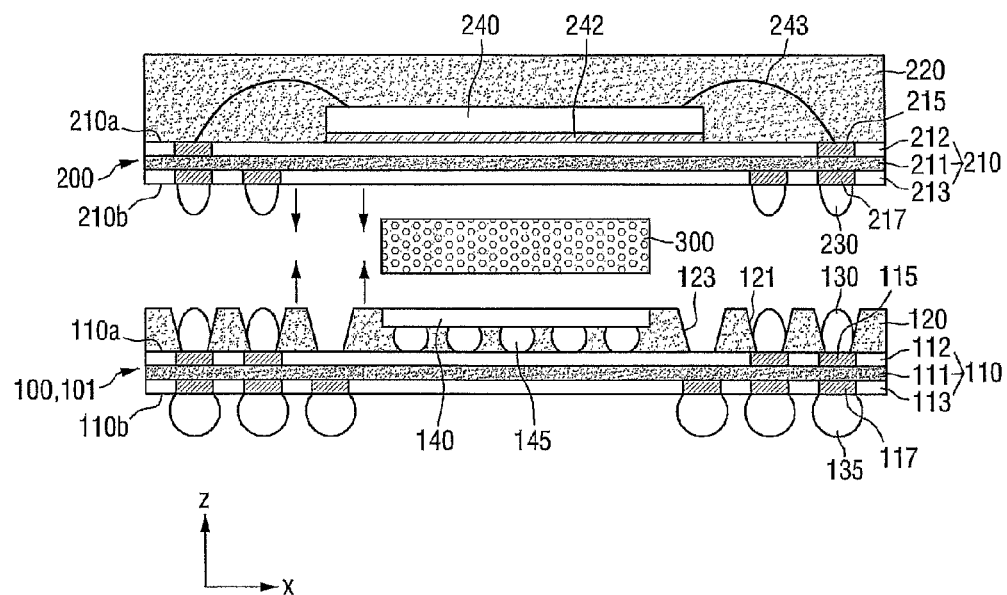
FIG. 1 is a cross-sectional view illustrating a state before a first package and a second package are adhered to each other in a package-on-package assembly in accordance with principles of inventive concepts.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
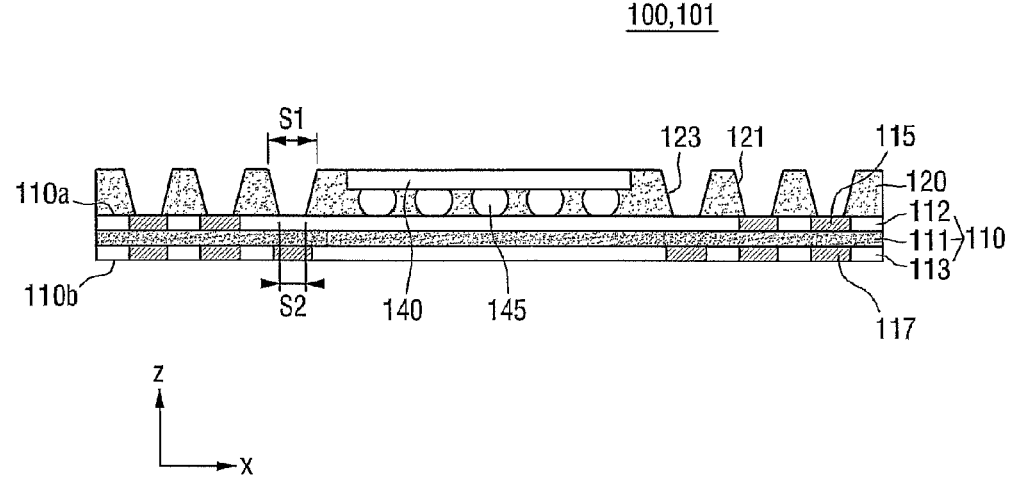
FIG. 2 is a cross-sectional view of the first package shown in FIG. 1.
Figure 3:
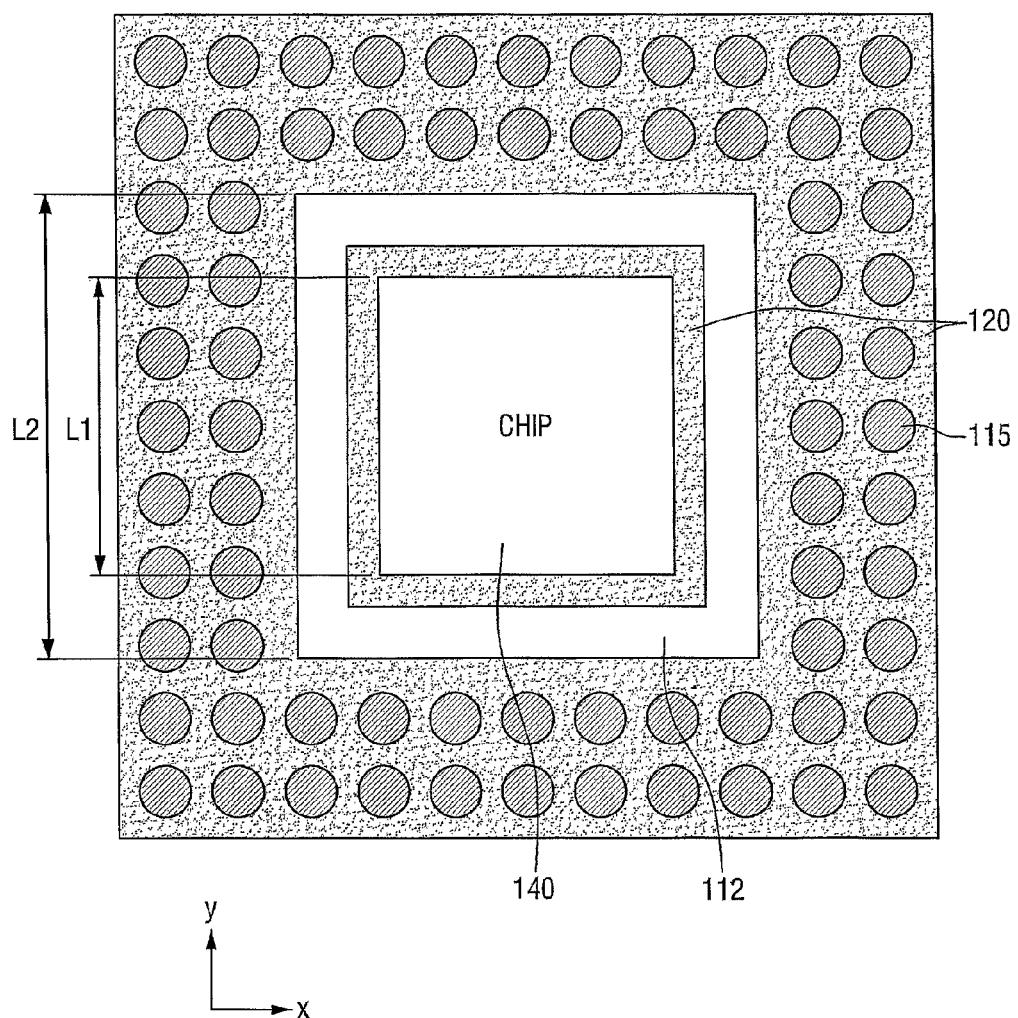
FIG. 3 is a plan view of the first package included in the package-on-package assembly in accordance with principles of inventive concepts.
Figure 4:
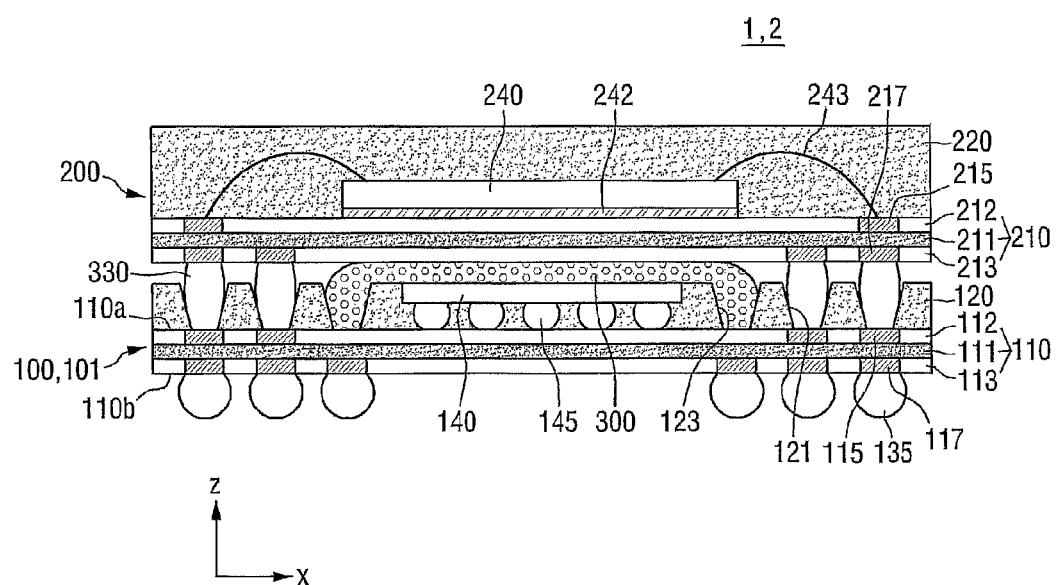
FIG. 4 is a cross-sectional view illustrating a package-on-package assembly in accordance with principles of inventive concepts.
Figure 5:
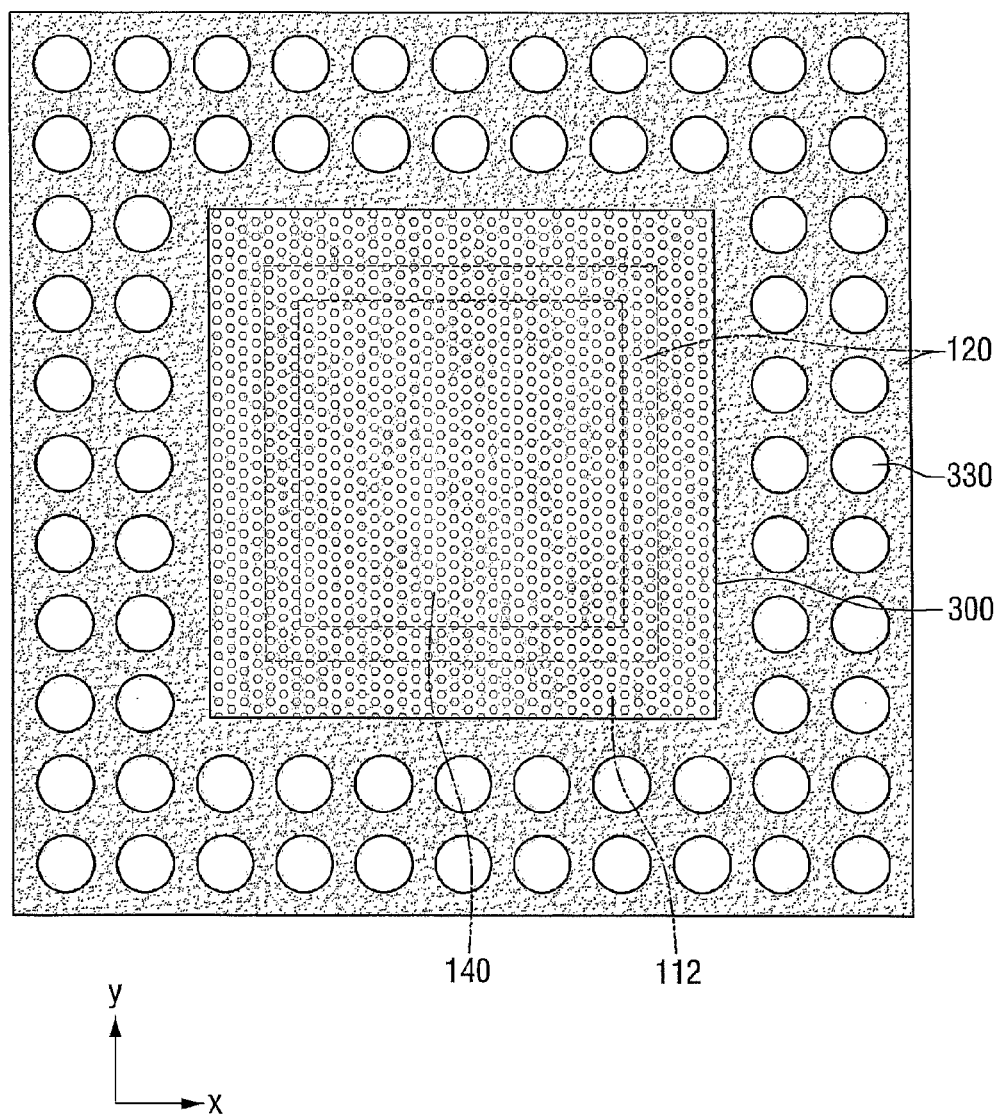
FIG. 5 is a plan view of the first package having an adhesion member included in the package-on-package assembly in accordance with principles of inventive concepts.

An exemplary embodiment of a package-on-package assembly in accordance with principles of inventive concepts will be described with reference to FIGS. 1 to 5. FIG. 1 is a cross-sectional view illustrating a first and second packages before they are adhered to one another in a package-on-package assembly in accordance with principles of inventive concepts; FIG. 2 is a cross-sectional view of the first package shown in FIG. 1; FIG. 3 is a plan view of the first package included in the exemplary embodiment of a package-on-package assembly in accordance with principles of inventive concepts; FIG. 4 is a cross-sectional view illustrating a package-on-package assembly in accordance with principles of inventive concepts; and FIG. 5 is a plan view of the first package having an adhesion member included in the package-on-package assembly in accordance with principles of inventive concepts.

Referring to FIGS. 1 and 4, a package-on-package assembly 1 includes a first package 100, a second package 200 and an adhesion member 300.

The package-on-package assembly 1 has a package-on-package structure, with the second package 200 formed, or mounted, on the first package. The first package 100 and the second package 200 may be combined with one another by the adhesion member 300 and internal connection terminal 330. The adhesion member 300 may be disposed between the first package 100 and the second package 200 and adheres the first package 100 to the second package 200. The internal connection terminal 330 is disposed between the first package 100 and the second package 200 and electrically and physically connects the first package 100 and the second package 200 to one another.

Referring to FIGS. 1, 2 and 4, the first package 100 may include a first substrate 110, a first semiconductor chip 140 and a first encapsulant member 120, for example.

The first substrate 110 may include, for example, a printed circuit board (PCB). The first substrate 110 has a first surface 110a, also referred to herein as "top," or "upper," surface 110a, and a second surface 110b, also referred to herein as "bottom," or "lower," surface 110b, facing each other. In an exemplary embodiment in accordance with principles of inventive concepts, the first substrate 110 may be implemented with first and second solder resist layers 112 and 113 formed, respectively, on top and bottom surfaces of a first core insulation layer 111.

In an exemplary embodiment in accordance with principles of inventive concepts, the first core insulation layer 111 may be made of, in whole, or in part, an insulating material, and the first and second solder resist layers 112 and 113 may be made of, in whole, or in part, solder-resist material, for example.

First and second land pads 115 and 117, also referred to herein, respectively, as upper and lower first substrate land pads, may be formed on the first and second surfaces 110a and 110b of the first substrate 110, respectively. Because the first and second solder resist layers 112 and 113 are formed to expose the first and second land pads 115 and 117, the first and second land pads 115 and 117 may be electrically connected to other connection terminals in contact therewith. For example, the first land pad 115 may be electrically connected to the first connection terminal 130 and the internal connection terminal 330 in contact therewith. Although not shown in FIGS. 1 and 3, a second external connection terminal 145 may also be electrically connected to the first land pad 115 in contact with the first land pad 115. In addition, the second land pad 117 may be electrically connected to the first external connection terminal 135 in contact with the first external connection terminal 135.

In accordance with principles of inventive concepts, the first connection terminal 130, the first and second external connection terminals 135, and 145 and an internal connection terminal 330 may be conductive balls or solder balls, for example. In addition, the first connection terminal 130, the first and second external connection terminals 135 and 145 and the internal connection terminal 330 may be, for example, a conductive bump, a conductive spacer, or a pin grid array (PGA).

The first semiconductor chip 140 may be mounted on the first surface 110a of the first substrate 110. For example, the first semiconductor chip 140 may be mounted on the first surface 110a of the first substrate 110 by a flip chip bonding method. The first semiconductor chip 140 may be electrically connected to the first substrate 110 through the second external connection terminal 145. In accordance with principles of inventive concepts, the first semiconductor chip 140 may be, for example, a memory chip such as DRAM or flash memory, or a logic chip forming a controller.

The first encapsulant member 120 may be formed on the first surface 110a of the first substrate 110 and may encapsulate the first surface 110a and, in whole, or in part, the first semiconductor chip 140. In accordance with principles of inventive concepts, the first encapsulant member 120 may cover the first surface 110a of the first substrate 110 and may fill a space between the first semiconductor chip 140 and the first surface 110a of the first substrate 110. A "top" surface of the first semiconductor chip 140 may be left uncovered by the first encapsulant member 120, in accordance with principles of inventive concepts.

In an exemplary embodiment in accordance with principles of inventive concepts, the first encapsulant member 120 may include a through-via 121 and a first trench 123. The through-via 121 and the first trench 123 may be formed using a laser drilled process (LDP) after forming the first encapsulant member 120 on the first surface 110a of the first substrate 110, for example. That is, in an exemplary embodiment in accordance with principles of inventive concepts, a portion of the first encapsulant member 120 may be removed by laser, thereby forming the through-via 121 and the first trench 123.

Cross-sections, particularly x-z planar cross sections, of through-via 121 and the first trench 123 will now be described with reference FIG. 2.

In an exemplary embodiment in accordance with principles of inventive concepts, the through-via 121 may be spaced apart from the first semiconductor chip 140. The through-via 121 may be formed on the first land pad 115 to expose at least one portion of the first land pad 115. The first connection terminal 130 and the internal connection terminal 330 may pass the through via 121 to then make contact with the first land pad 115, for example.

The first trench 123 may be formed between the first semiconductor chip 140 and the through via 121. In an exemplary embodiment in accordance with principles of inventive concepts, the first surface 110a of the first substrate 110, specifically a portion of the first solder resist layer 112, may be exposed by the first trench 123, for example. In an exemplary embodiment in accordance with principles of inventive concepts, the first trench 123 may leave the first surface 110a of the first substrate 110 covered, as will be described in the discussion related to upcoming FIGs.

In an exemplary embodiment in accordance with principles of inventive concepts, the first trench 123 may have a positive lateral profile. That is to say, the top sectional area S1 of the first trench 123 may be greater than the bottom sectional area S2 thereof. However, the sectional shape of the first trench 123 is not limited to that shown in FIG. 2 and may have various shapes, as will be described in greater detail in the discussion related to upcoming FIGs.

The x-z planar cross sections of the through-via 121 and the first trench 123 will be described with reference to FIGS. 2 and 3.

In an exemplary embodiment in accordance with principles of inventive concepts, the through-via 121 may be spaced apart from the first semiconductor chip 140, to be arranged along a lateral surface of the first substrate 110. For example, the through-via 121 may be arranged along the periphery of the first substrate 110 to surround the first semiconductor chip 140. In addition, the first land pad 115 may be exposed by the through-via 121. A sectional shape of the through-via 121 may be a circular shape, for example.

The first trench 123 may be formed between the semiconductor chip 140 and the through-via 121. In addition, the first trench 123 may extend lengthwise along a lateral surface of the first semiconductor chip 140. For example, the first trench 123 may be shaped to surround the first semiconductor chip 140 along the lateral surface of the first semiconductor chip 140. In such an exemplary embodiment, the length L2 of an area extending in one direction of the first trench 123 may be greater than the length L1 of the lateral surface of the first semiconductor chip 140, for example. In addition, the first surface 110a of the first substrate 110, specifically, first solder resist layer 112, may be exposed by the first trench 123.

In an exemplary embodiment in accordance with principles of inventive concepts, the first encapsulant member 120 may be formed of an epoxy molding compound (EMC), for example. In addition, the adhesion member 300 may be formed of, for example, epoxy. However, a material forming the first encapsulant member 120 and a material forming the adhesion member 300 may be different from each other in that a size of a filler contained in the first encapsulant member 120 may be larger than that of a filler contained in the adhesion member 300.

In an exemplary embodiment in accordance with principles of inventive concepts, the second package 200 may include a second substrate 200, a second semiconductor chip 240, and a second encapsulant member 220.

The second substrate 200 may be include, for example, a printed circuit board (PCB). In an exemplary embodiment, the second substrate 210 has a third surface 210a, also referred to herein as the upper, or top, surface of the second substrate, and a fourth surface 210b, also referred to herein as the lower, or bottom, surface of the second substrate, facing each other. For example, the second substrate 210 may include third and fourth solder resist layers 212 and 213, also referred to herein, respectively, as top and bottom second substrate solder resist layers 212, 213, respectively formed on top and bottom surfaces of second core insulation layer 211.

The second core insulation layer 211 may be made, in whole or in part, of an insulating material, such as fiberglass, and the third and fourth solder resist layers 212 and 213 may be made, in whole or in part, of solder-resist material.

Third and fourth land pads 215 and 217, also referred to herein, respectively, as upper and lower land pads of second substrate, may be formed on the third and fourth solder resist layers 212 and 213, that is, top and bottom second substrate solder resist layers 212, 213, respectively, of the second substrate 210. Because the third and fourth solder resist layers 212 and 213 are formed to expose the third and fourth land pads 215 and 217, the third and fourth land pads 212 and 213 may be electrically connected to other connection terminals in contact therewith. For example, the third land pad 215 may be electrically connected to a wire 243 and the fourth land pad 217 may be electrically connected to the second connection terminal 230 and, through the connection terminal 230, the internal connection terminal 330.

The second semiconductor chip 240 may be mounted on the third surface 210a, or upper surface of the second substrate 210. For example, the second semiconductor chip 240 may be attached to the third surface 210a, or upper surface of the second substrate 210, using a chip adhesion member 242. The second semiconductor chip 240 may be mounted on the second substrate 210 by a flip chip bonding method, for example, and may be electrically connected to the second substrate 210 through wire 243.

The second encapsulant member 220 may be formed on the third surface 210a, or upper surface of the second substrate 210, and may encapsulate the third surface 210a and the second semiconductor chip 240.

An exemplary process of forming the package-on-package assembly 1 in accordance with principles of inventive concepts by combining the first package 100 with the second package 200 will now be described with reference to FIGS. 1, 4 and 5.

Referring to FIG. 1, in an exemplary embodiment in accordance with principles of inventive concepts, the adhesion member 300 is positioned between the first package 100 and the second package 200 so that the first connection terminal 130 of the first package 100 and the second connection terminal 230 of the second package 200 make contact with each other.

Referring to FIGS. 4 and 5, the first connection terminal 130 and the second connection terminal 230 are subjected to a reflow process, thereby forming the internal connection terminal 330 and making the adhesion member 300 come into contact with the first package 100 and the second package 200, for example, by at least partially melting the adhesion member 300.

One end of the internal connection terminal 330 formed by the reflow process may come into contact with the first land pad 115, or upper land pad of the first substrate, and the other end thereof may come into contact with the fourth land pad 217 of the second package 200, or lower land pad of the second substrate. Therefore, the first and second packages 100 and 200 may be electrically connected through the internal connection terminal 330 and the first and second substrates mechanically connected through the adhesion member 300. The internal connection terminal 330 may pass the through via 121, for example.

One surface area of the adhesion member 300 may be adhered to a top surface of the first semiconductor chip 140 of the first package 100 and a region of the first encapsulant member 120. In addition, another surface area of the adhesion member 300 may be adhered to the fourth surface 210b, or bottom surface of the second package 200. When the adhesion member 300 is melted, it may become somewhat fluid, thereby allowing the adhesion member 300 to flow between the first package 100 and the second package 200.

In an exemplary embodiment of a package-on-package assembly 1 in accordance with principles of inventive concepts, the first package 100 includes the first trench 123 formed between the first semiconductor chip 140 and the through via 121 and, during the reflow process, excess adhesion member material flowing from a top portion of the first semiconductor chip 140 gathers in a space of the first trench 123. In this manner, the first trench 123 may prevent the adhesion member 300 from flowing up to the through-via 121. That is to say, the first trench 123 may serve as a reservoir that prevents contamination, or smearing, of the first connection terminal 130 positioned in the through-via 121 with the adhesion member material, which may otherwise reduce the reliability of the internal connection terminal 330.

In an exemplary embodiment in accordance with principles of inventive concepts, the first trench 123 is positioned between the first semiconductor chip 140 and the through-via 121 and extends lengthwise along the lateral surface of the first semiconductor chip 140 and surrounds the first semiconductor chip 140. Therefore, excess adhesion member 300 material flowing in all directions may be stored in the first trench 123, thereby preventing adhesion member 300 material from flowing in all directions. In this manner, it is possible to prevent the adhesion member 300 material from flowing into through-vias 121, but, rather, to flow and surround the first semiconductor chip 140.

In accordance with principles of inventive concepts, controlling the flow of adhesion member material prevents connection terminal contamination with, or smearing by, adhesion member material and, thereby ensures that the reliability of the internal connection 330 is not compromised by adhesion member material, for example. After the reflow process, the adhesion member 300 may extend from the top surface of the first semiconductor chip 140 to contact the bottom surface of substrate 210 (for example, the bottom surface of resist layer 213), and may fill at least a portion of first trench 123 to make contact with the first solder resist layer 112. That is, a portion of the adhesion member 300 may come into contact with the first solder resist layer 112 exposed by the first trench 123, but the trench 123 prevents the adhesion material from forming in the through-via 121.

Figure 6:
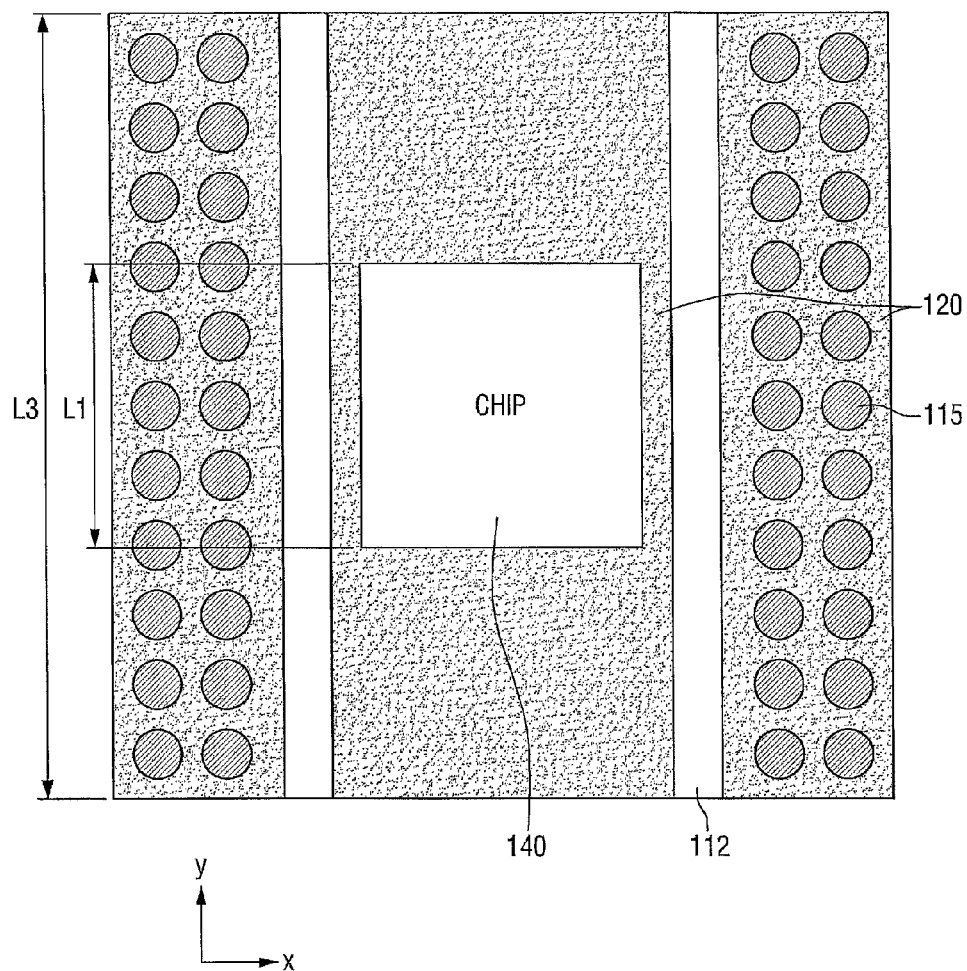
FIG. 6 is a plan view of the first package included in the package-on-package assembly in accordance with principles of inventive concepts.

An second exemplary embodiment of a package-on-package assembly in accordance with principles of inventive concepts will be described with reference to FIGS. 2, 4, 6 and 7. The following description will focus on differences between the package-on-package assembly 1 according to the first embodiment and the package-on-package assembly 2 according to the second embodiment. FIG. 6 is a plan view of the first package included in the package-on-package assembly according to the second embodiment of the present inventive concept and FIG. 7 is a plan view of the first package having an adhesion member included in the package-on-package assembly according to the second embodiment of the present inventive concept.

Referring to FIGS. 2 and 6, in a second exemplary embodiment of a package-on-package assembly 2 in accordance with principles of inventive concepts, a first package 101 may include first trenches 123 formed on each side of the first semiconductor chip 140 and extending lengthwise along a lateral surface of the first semiconductor chip 140. The first trenches 123 may extend from one end to the other of the first substrate 110 in a first direction (e.g., in the y direction). In this exemplary embodiment, the length L1 of the lateral surface of the first semiconductor chip 140 may be shorter than the length L3 of the first trench 123. In this exemplary embodiment in accordance with principles of inventive concepts, through via(s) 121 may not be formed in the area between first trenches 123 and, as a result, first land pad(s) 115 may not be exposed in the area between first trenches 123.

Figure 7:
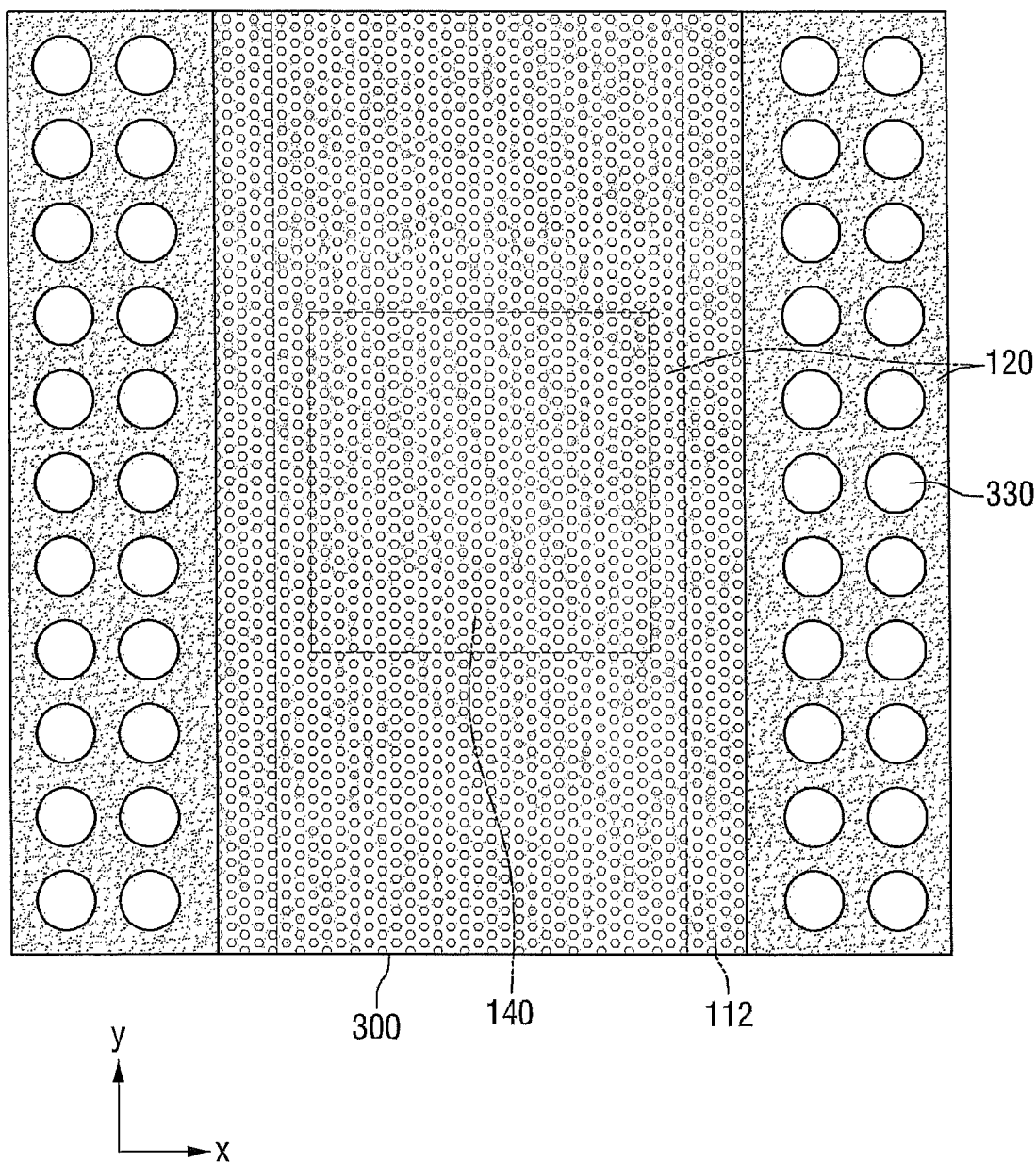
FIG. 7 is a plan view of the first package having an adhesion member included in the package-on-package assembly in accordance with principles of inventive concepts.

Referring to FIGS. 6 and 7, in and exemplary embodiment in accordance with principles of inventive concepts, trenches 123 prevent adhesion member 300 material from flowing to through-vias 121 positioned on either side of the first substrate 110. In this exemplary embodiment, there are no land pads exposed between the trenches 123 and, as a result adhesion member material may flow there freely without contaminating any through-vias.

Figure 8:
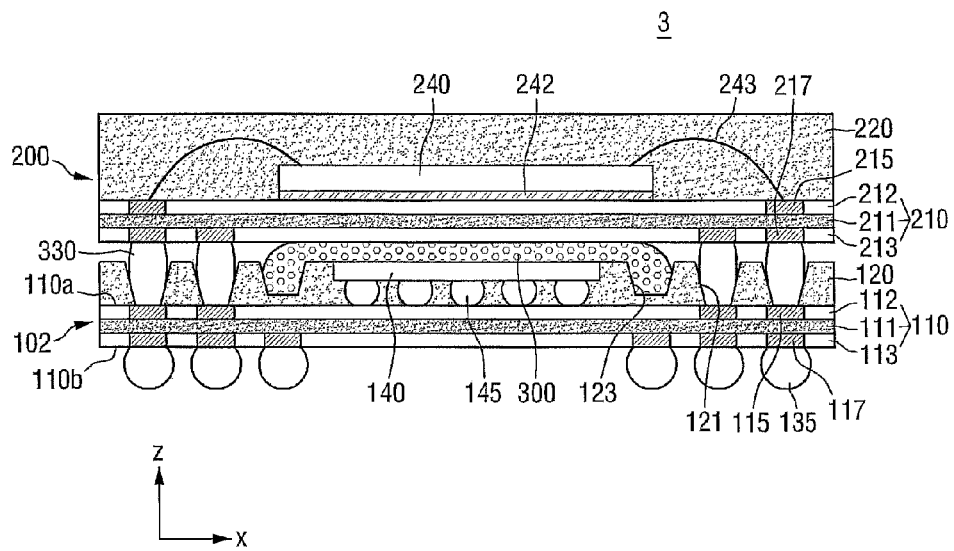
FIG. 8 is a cross-sectional view illustrating a package-on-package assembly in accordance with principles of inventive concepts.

An exemplary, third, package-on-package assembly embodiment in accordance with principles of inventive concepts will be described with reference to the cross-sectional view of FIG. 8. The following description will focus on differences between the package-on-package assembly 1 according to the first exemplary embodiment and the package-on-package assembly 3 according to the third exemplary embodiment. In this exemplary embodiment, first trenches 123 of a first package 102 may not expose a first surface 110a of a first substrate 110. For example, the first trenches 123 of the first package 102 may not expose a first solder resist layer 112. That is to say, a portion of a first encapsulant member 120 may be positioned between the first trenches 123 and the first surface 110a of the first substrate 110. The encapsulant material positioned between first trenches 123 and first surface 110a of the first substrate 110 may be left intact during formation of the trenches 123, for example.

Figure 9:
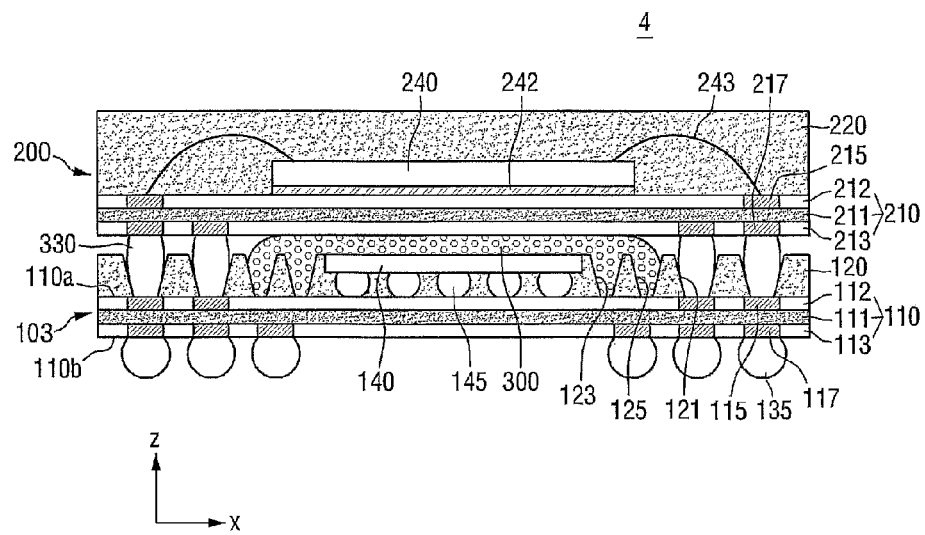
FIG. 9 is a cross-sectional view illustrating a package-on-package assembly in accordance with principles of inventive concepts.

A fourth exemplary embodiment of a package-on-package assembly in accordance with principles of inventive concepts will be described with reference to the cross-sectional view of FIG. 9. The following description will focus on differences between the package-on-package assembly 1 according to the first embodiment and the package-on-package assembly 4 according to the fourth embodiment. In this exemplary embodiment, a first encapsulant member 120 of a first package 103 may include a plurality of trenches, such as first and second trenches 123 and 125. That is, a plurality of trenches, first and second trenches 123 and 125 in this exemplary embodiment, may be formed between a first semiconductor chip 140 and through vias 121. In this exemplary embodiment, adhesion member 300 material may be stored in a plurality of trenches, thereby accommodating a greater volume of adhesion member material in the larger reservoir formed by the plurality of trenches.

Figure 10:
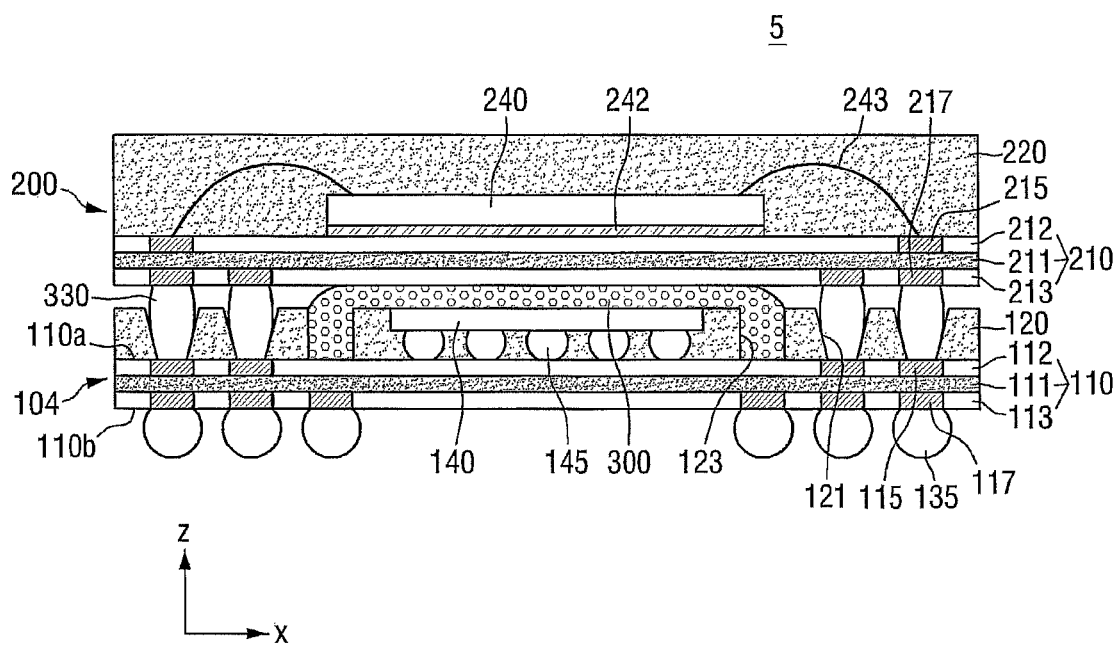
FIG. 10 is a cross-sectional view illustrating a package-on-package assembly in accordance with principles of inventive concepts.

A fifth exemplary embodiment of a package-on-package assembly in accordance with principles of inventive concepts will be described with reference to the cross-sectional view of FIG. 10. The following description will focus on differences between the package-on-package assembly 1 according to the first exemplary embodiment and the package-on-package assembly 5 according to the fifth exemplary embodiment. In the package-on-package assembly 5 according to the fifth exemplary embodiment in accordance with principles of inventive concepts, x-z planar cross sections of the first trench 123 may be rectangular. That is to say, a top sectional area of the first trench 123 may be substantially the same as a bottom sectional area thereof.

Figure 11:
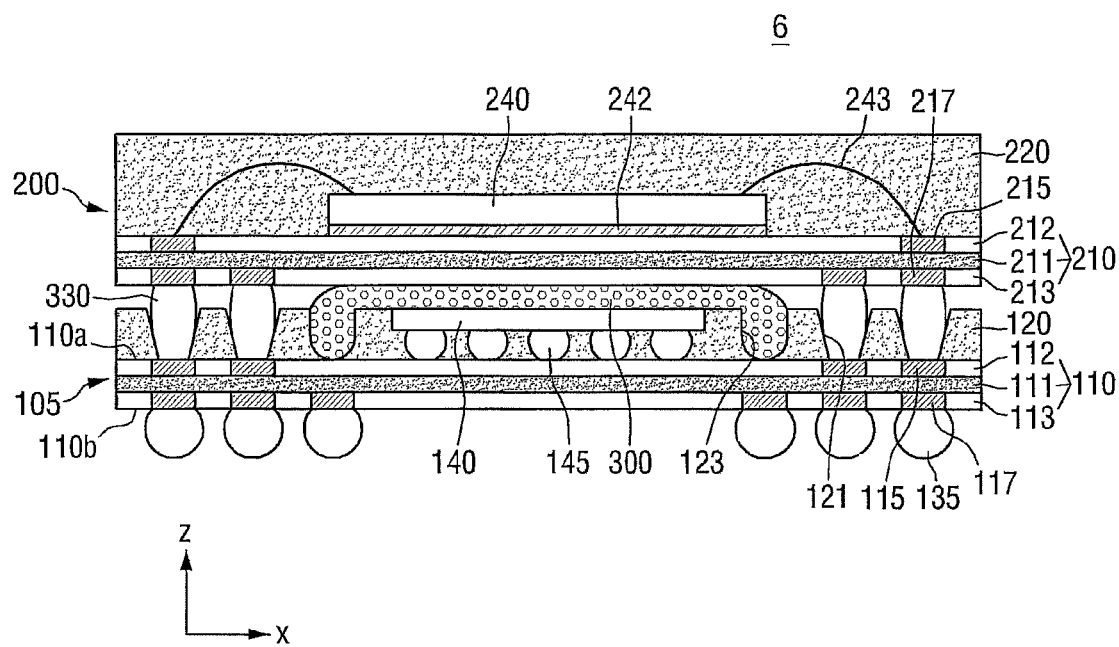
FIG. 11 is a cross-sectional view illustrating a package-on-package assembly in accordance with principles of inventive concepts.

A sixth exemplary embodiment of a package-on-package assembly in accordance with principles of inventive concepts will be described with reference to the cross-sectional view of FIG. 11. The following description will focus on differences between the exemplary embodiment of package-on-package assembly 1 and the exemplary embodiment of package-on-package assembly 6 in accordance with principles of inventive concepts. In the exemplary package-on-package assembly 6, x-z planar cross sections of first trenches 123 may be U-shaped.

Figure 12:
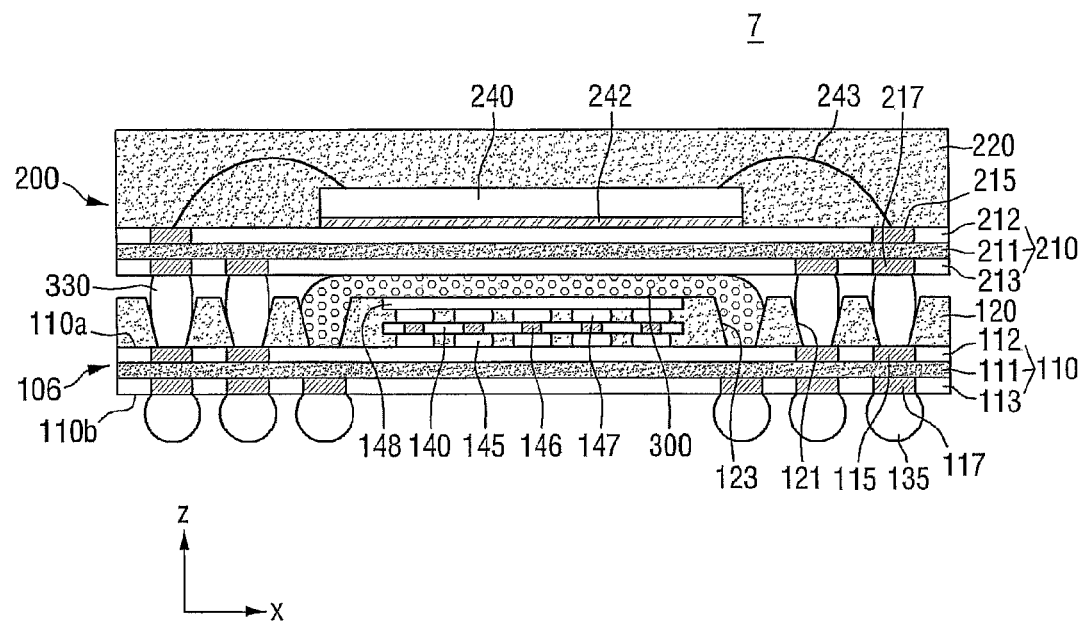
FIG. 12 is a cross-sectional view illustrating a package-on-package assembly in accordance with principles of inventive concepts.

A seventh exemplary embodiment of a package-on-package assembly in accordance with principles of inventive concepts will be described with reference to the cross-sectional view of FIG. 12. The following description will focus on differences between the first exemplary package-on-package assembly 1 and the seventh exemplary package-on-package assembly 7 in accordance with principles of inventive concepts. In the exemplary package-on-package assembly 7, first and third semiconductor chips 140 and 148 may be stacked on a first package 106. The first semiconductor chip 140 and the third semiconductor chip 148 may be electrically connected by a third external connection terminal 147, and a via electrode 146 may be formed in the first semiconductor chip 140 to be electrically connected to the third semiconductor chip 148.

Exemplary embodiments of semiconductor systems in accordance with principles of inventive concepts will be described with reference to FIGS. 13 to 16. Such systems may employ a package-on-package assembly in accordance with principles of inventive concepts, such as described in the discussion related to previous FIGs, for example.

Figure 13:
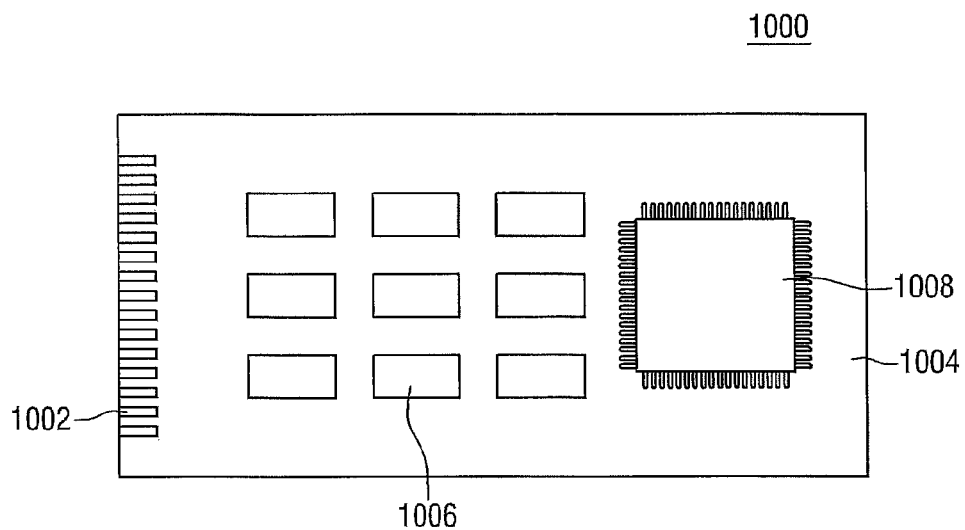
FIG. 13 is a plan view of a semiconductor system in accordance with principles of inventive concepts.

FIG. 13 is a plan view of an exemplary embodiment of a semiconductor system 1000 in accordance with principles of inventive concepts. The semiconductor system 1000 may be a package module, for example, and may include a module substrate 1004 provided with an external connection terminal 1002, and semiconductor devices 1006 and 1008. The semiconductor device 1008 may be a quad flat package (QFP). Either one, or both, of the semiconductor devices 1006 and 1008 may be formed using a package-on-package assembly in accordance with principles of inventive concepts. As previously described, a package-on-package assembly in accordance with principles of inventive concepts may include a first package, a second package formed on the first package, and an adhesion member positioned between the first and second packages that adheres the first package to the second package. The first package may include a first surface and a second surface facing each other. A first substrate may include a land pad formed on the first surface, a first semiconductor chip may be mounted on the first surface, and a first encapsulant member may encapsulate at least a portion of the first surface and the first semiconductor chip. The encapsulant may include a through-via exposing the land pad. A trench may be formed between the first semiconductor chip and the through-via, with at least a portion of the trench filled with adhesion member material.

Figure 14:
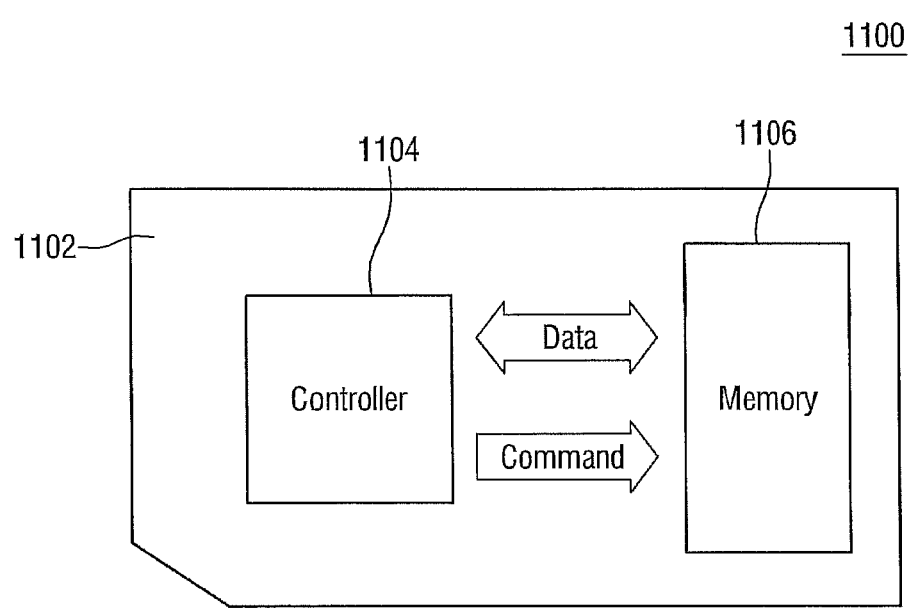
FIG. 14 is a block view of a semiconductor system in accordance with principles of inventive concepts.

FIG. 14 is a block diagram view of a semiconductor system in accordance with principles of inventive concepts. The semiconductor system 1100 may be a memory card, for example. The semiconductor system 1100 may include a controller 1104 and a memory 1106 provided in a housing 1102. The controller 1104 and the memory 1106 may exchange electrical signals. For example, the controller 1104 and the memory 1106 may exchange data under a command of the controller 1104. Accordingly, in the semiconductor system 1100, data may be stored in or retrieved from the memory 1106. The controller 1104 and/or the memory 1106 may be formed using a package-on-package assembly in accordance with principles of inventive concepts.

A semiconductor system 1100 in accordance with principles of inventive concepts may be used as a data storage medium in a variety of portable devices and may include a multimedia card (MMC) or a secure digital (SD) card.

Figure 15:
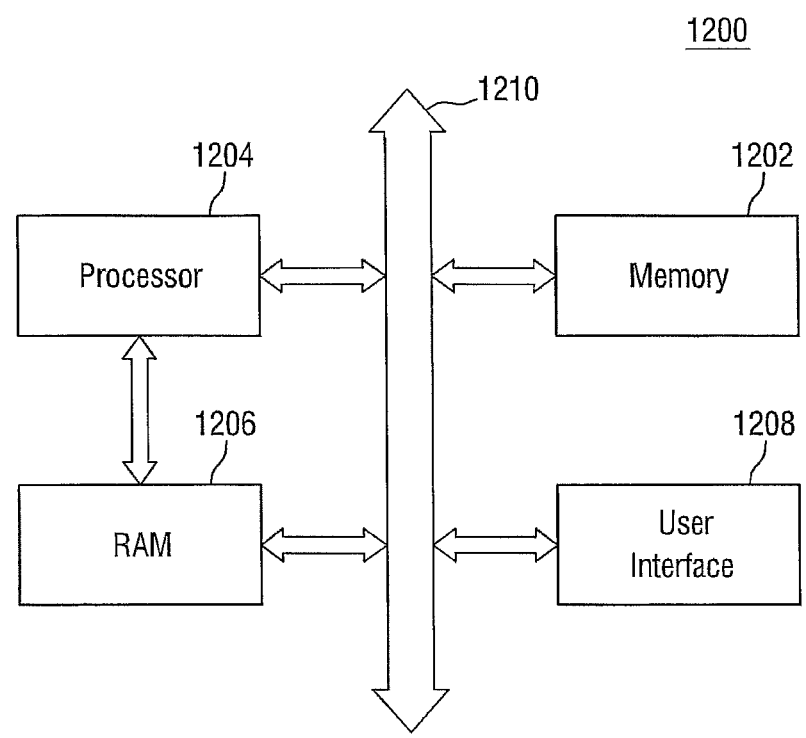
FIG. 15 is a block view of a semiconductor system in accordance with principles of inventive concepts.
Figure 16:
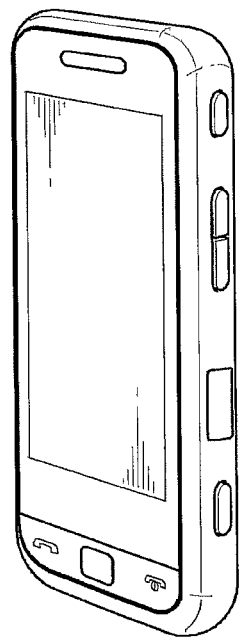
FIG. 16 illustrates an example of an electronic device which may incorporate a semiconductor system in accordance with principles of inventive concepts.

FIG. 15 is a block diagram of a semiconductor system 1200 in accordance with principles of inventive concepts, and FIG. 16 illustrates an example of an electronic device in accordance with principles of inventive concepts such as may employ a package-on-package assembly in accordance with principles of inventive concepts, including such as may be employed in semiconductor 1200.

Referring to FIG. 15, the semiconductor system 1200 may include a memory system 1202, a processor 1204, a RAM 1206 and a user interface 1208, which may perform data communication with one another using a bus 1210. The processor 1204 may execute a program and may control the semiconductor system 1200. The RAM 1206 may be used as an operating memory of the processor 1204. The processor 1204 and the RAM 1206 may be included in a single package. For example, a logic chip including the processor 1204 and a memory chip including the RAM 1206 may be included in a system in package to perform wireless communication. The user interface 1208 may be used to input/output data to/from the semiconductor system 1200. The memory system 1202 may store codes for operating the processor 1204, data processed by the processor 1204 or externally input data. The memory system 1202 may include a controller and a memory and may be configured in the same or similar manner as the memory card 1100 shown in FIG. 14.

A semiconductor system in accordance with principles of inventive concepts, such as semiconductor system 1200, may be applied to a variety of electronic devices. For example, such a semiconductor system may be applied to a cellular phone (for example, cellular phone1300 of FIG. 16), a portable game instrument, portable notebook computers, MP3 players, navigation devices, solid state disks (SSDs), automobiles, or household appliances.

While exemplary embodiments in accordance with principles of inventive concepts have been particularly shown and described, it will be understood that various changes in form and details may be made therein without departing from the spirit and scope of inventive concepts as defined by the following claims. It is therefore desired that exemplary embodiments be considered in all respects as illustrative and not restrictive, reference being made to the appended claims rather than the foregoing description to indicate the scope of inventive concepts.

What is claimed is:

1. A package-on-package assembly comprising:
    a first package;
    a second package formed on the first package; and
    an adhesion member positioned between the first and second packages and adhering the first package and the second package to each other,
    wherein the first package comprises:
    a first substrate having a first surface and a second surface facing each other and including a land pad formed on the first surface;
    a first semiconductor chip formed on the first surface; and
    a first encapsulant member encapsulating the first surface and the first semiconductor chip and including a through-via spaced apart from the first semiconductor chip and exposing the land pad, and a trench formed between the first semiconductor chip and the through via, and
    wherein at least a portion of the trench is filled with the adhesion member.

2. The package-on-package assembly of claim 1, further comprising a connection terminal having one end contacting the land pad and the other end contacting the second package and passing the through via.

3. The package-on-package assembly of claim 1, wherein the trench is shaped of a groove and the first surface is not exposed by the trench.

4. The package-on-package assembly of claim 3, wherein a portion of the first encapsulant member is positioned between the trench and the first surface.

5. The package-on-package assembly of claim 1, wherein the first substrate further comprises a solder resist layer formed on the first surface to expose the land pad, and the trench exposes the solder resist layer.

6. The package-on-package assembly of claim 5, wherein a portion of the adhesion member enters the trench and contacts the solder resist layer.

7. The package-on-package assembly of claim 1, wherein the adhesion member extends from a top portion of the first semiconductor chip and fills at least a portion of the trench without contacting the through-via.

8. The package-on-package assembly of claim 1, wherein the trench extends along a lateral surface of the first semiconductor chip.

9. The package-on-package assembly of claim 1, wherein the second package has a third surface and a fourth surface facing each other, the fourth surface including a second substrate adjacent to the first encapsulant member, a second semiconductor chip formed on the third surface of the second substrate, and a second encapsulant member encapsulating the second semiconductor chip.

10. The package-on-package assembly of claim 1, wherein a material forming the adhesion member is different from a material forming the first encapsulant member.

11. A package-on-package assembly comprising:
    a first package;
    a second package formed on the first package; and
    an adhesion member positioned between the first and second packages and adhering the first package and the second package to each other,
    wherein the first package comprises:
    a substrate having a first surface and a second surface facing each other and including a plurality of land pads formed on the first surface;
    a semiconductor chip formed on the surface; and
    an encapsulant member encapsulating the first surface and the semiconductor chip and including a plurality of through-vias spaced apart from the semiconductor chip and arranged along a lateral surface of the substrate and exposing the land pads and trenches formed between the semiconductor chip and the through-vias and extending along a lateral surface of the semiconductor chip, and
    wherein at least a portion of the trench is filled with adhesion member material.

12. The package-on-package assembly of claim 11, wherein the trench is longer than the lateral surface of the semiconductor chip.

13. The package-on-package assembly of claim 12, wherein the trench extends along the lateral surface of the semiconductor chip to surround the semiconductor chip.

14. The package-on-package assembly of claim 11, further comprising a plurality of connection terminals each having one end contacting the land pad and the other end contacting the second package and passing the through via.

15. The package-on-package assembly of claim 11, wherein the adhesion member extends from a top portion of the semiconductor chip and fills at least one portion of the trench while not being farmed in the through via.

16. An apparatus, comprising:
    first and second semiconductor chips respectively mounted on first and second substrates;
    an adhesion member formed between the first and second substrates; and
    a reservoir formed on one of the substrates to contain adhesion member material to prevent contamination of connection elements formed between first and second substrates; and
    a through-via formed in an encapsulant member formed on the substrate upon which a reservoir is formed, wherein the reservoir is configured to prevent flow of adhesion member material into the through-via.

17. The apparatus of claim 16, wherein the reservoir is a trench formed in encapsulant material on one of the substrates.

18. The apparatus of claim 16 further comprising internal connection terminals connecting first and second substrates, wherein the connection materials are formed of reflown conductor material.

19. A cellular telephone employing the apparatus of claim 16.

* * * * *